US007955651B2

(12) United States Patent
Ruppi

(10) Patent No.: US 7,955,651 B2
(45) Date of Patent: *Jun. 7, 2011

(54) ENHANCED ALUMINA LAYER WITH TEXTURE

(75) Inventor: Sakari Ruppi, Fagersta (SE)

(73) Assignee: Seco Tools AB, Fagersta (SE)

(*) Notice: Subject to any disclaimer, the term of this patent is extended or adjusted under 35 U.S.C. 154(b) by 115 days.

This patent is subject to a terminal disclaimer.

(21) Appl. No.: 12/188,708

(22) Filed: Aug. 8, 2008

(65) Prior Publication Data

US 2008/0299314 A1 Dec. 4, 2008

Related U.S. Application Data

(62) Division of application No. 11/264,383, filed on Nov. 2, 2005, now Pat. No. 7,442,431.

(30) Foreign Application Priority Data

Nov. 9, 2004 (SE) .................................. 0402691

(51) Int. Cl.
C23C 16/40 (2006.01)
C23C 16/30 (2006.01)
(52) U.S. Cl. ........... 427/255.31; 427/255.39; 427/249.1; 427/255.394; 427/255.7
(58) Field of Classification Search ............. 427/255.31, 427/255.39, 249.1, 255.394, 255.7
See application file for complete search history.

(56) References Cited

U.S. PATENT DOCUMENTS

| 4,393,735 A | 7/1983 | Eckle et al. |
| 4,619,866 A | 10/1986 | Smith et al. |
| 4,927,301 A | 5/1990 | Reiterman |
| 5,137,774 A | 8/1992 | Ruppi |
| 5,154,551 A | 10/1992 | Noggle |
| 5,156,501 A | 10/1992 | Pawlik et al. |
| 5,320,458 A | 6/1994 | Reiterman et al. |

(Continued)

FOREIGN PATENT DOCUMENTS

EP 0 556 422 A1 2/1992

(Continued)

OTHER PUBLICATIONS

Y. Yoursdshahyan, C. Ruberto, M. Halvarsson, V. Langer, S. Ruppi, U. Rolander and B.I. Lundqvist, Theoretical Structure Determination of a Complex Material: κ-Al2O3, J. Am. Ceram. Soc. 82(6) (1999) 1365-1380).

(Continued)

Primary Examiner — Bret Chen
(74) Attorney, Agent, or Firm — Drinker Biddle & Reath, LLP

(57) ABSTRACT

A refined method to produce textured $\alpha$-$Al_2O_3$ layers in a temperature range of 750-1000° C. with a controlled texture and substantially enhanced wear resistance and toughness than the prior art is disclosed. The $\alpha$-$Al_2O_3$ layer is formed on a bonding layer of (Ti,Al)(C,O,N) with increasing aluminum content towards the outer surface. Nucleation of $\alpha$-$Al_2O_3$ is obtained through a nucleation step composed of short pulses and purges of Ti-containing and oxidizing steps. The $\alpha$-$Al_2O_3$ layer has a thickness ranging from 1 to 20 μm and is composed of columnar grains. The length/width ratio of the alumina grains is from 2 to 15, preferably 6 to 10. The layer is characterized by a strong (110) growth texture, measured using XRD, and by the low intensity of (012), (104), (113), (024) and (116) diffraction peaks.

16 Claims, 1 Drawing Sheet

U.S. PATENT DOCUMENTS

| | | | |
|---|---|---|---|
| 5,654,035 A | 8/1997 | Ljungberg et al. | |
| 5,702,808 A | 12/1997 | Ljungberg | |
| 5,766,782 A | 6/1998 | Ljungberg | |
| 5,770,261 A | 6/1998 | Nakamura et al. | |
| 5,851,687 A | 12/1998 | Ljungberg | |
| 5,861,210 A | 1/1999 | Lenander et al. | |
| 5,863,640 A | 1/1999 | Ljungberg et al. | |
| 5,913,643 A | 6/1999 | Fowler et al. | |
| 5,980,988 A * | 11/1999 | Ljungberg | 427/255.19 |
| 6,238,150 B1 | 5/2001 | Yamada et al. | |
| 6,284,356 B1 | 9/2001 | Kiriyama | |
| 6,293,739 B1 | 9/2001 | Uchino et al. | |
| 6,333,098 B1 | 12/2001 | Olsson et al. | |
| 6,333,103 B1 | 12/2001 | Ishii et al. | |
| 6,337,152 B1 | 1/2002 | Kukino et al. | |
| 6,436,519 B2 | 8/2002 | Holzschuh | |
| 6,572,991 B1 | 6/2003 | Ruppi | |
| 7,094,447 B2 * | 8/2006 | Ruppi | 427/419.7 |
| 7,163,735 B2 * | 1/2007 | Ruppi | 428/216 |
| 7,396,581 B2 * | 7/2008 | Ruppi | 428/216 |
| 7,442,431 B2 * | 10/2008 | Ruppi | 428/216 |
| 7,442,432 B2 * | 10/2008 | Ruppi | 428/216 |
| 7,455,900 B2 * | 11/2008 | Ruppi | 428/216 |
| 7,695,764 B2 * | 4/2010 | Ruppi | 427/255.34 |
| 2001/0006724 A1 | 7/2001 | Holzschuh | |
| 2002/0122701 A1 | 9/2002 | Ljungberg et al. | |
| 2002/0155325 A1 | 10/2002 | Martensson | |
| 2002/0176755 A1 * | 11/2002 | Ruppi | 407/118 |
| 2003/0108752 A1 * | 6/2003 | Konig et al. | 428/469 |
| 2004/0028951 A1 | 2/2004 | Ruppi | |
| 2004/0029851 A1 | 2/2004 | Murphy et al. | |
| 2006/0115662 A1 | 6/2006 | Ruppi | |
| 2006/0141271 A1 | 6/2006 | Ruppi | |
| 2006/0199026 A1 | 9/2006 | Ruppi | |
| 2008/0311290 A1 | 12/2008 | Ruppi | |

FOREIGN PATENT DOCUMENTS

| | | |
|---|---|---|
| EP | 0 693 574 A1 | 7/1995 |
| JP | 5295517 A | 11/1993 |
| JP | 10-068077 | 3/1998 |
| JP | 10076405 A | 3/1998 |
| JP | 2002028803 A | 1/2002 |
| SE | 502 223 | 9/1995 |
| SE | 502174 C2 | 9/1995 |
| SE | 504968 C2 | 6/1997 |
| SE | 0201417-3 | 3/2005 |
| SE | 525581 C2 | 3/2005 |
| WO | WO 95/19457 | 7/1995 |
| WO | WO 98/10119 | 3/1998 |

OTHER PUBLICATIONS

Provision of the minutes in accordance with Rule 124(4) EPC dated Jul. 19, 2010 issued in EP 05 445 083.8.

Communication pursuant to Rule 82(2) EPC dated Nov. 9, 2010 issued in EP 05 445 083.8.

Kim et al., "Effect of Partial Pressure of the Reactant Gas on the Chemical Vapour Deposition of $Al_2O_3$," Thin Solid Films, vol. 97, 1982, pp. 97-106.

* cited by examiner

ENHANCED ALUMINA LAYER WITH TEXTURE

RELATED APPLICATION DATA

This application is a divisional application of U.S. application Ser. No. 11/264,383, filed Nov. 2, 2005, now U.S. Pat. No. 7,442,431, which claims priority under 35 U.S.C. §119 and/or §365 to Swedish Application No. 0402691-0 filed Nov. 5, 2004, the entire disclosure of each of these prior applications are incorporated herein by reference.

BACKGROUND OF THE INVENTION

The present invention relates to a coated cutting tool insert designed to be used in metal machining. The substrate can be a cemented carbide, cermet, ceramic or cBN on which a hard and wear resistant coating is deposited. The coating exhibits an excellent adhesion to the substrate covering all functional parts thereof. The coating is composed of one or more refractory layers of which at least one layer is a strongly textured alpha-alumina ($\alpha$-$Al_2O_3$) deposited in the temperature range of from about 750 to about 1000° C.

A crucial step in the deposition of different $Al_2O_3$ polymorphs is the nucleation step. $\kappa$-$Al_2O_3$ can be grown in a controlled way on {111} surfaces of TiN, Ti(C,N) or TiC having the fcc structure. TEM has confirmed the growth mode which is that of the close-packed (001) planes of $\kappa$-$Al_2O_3$ on the close-packed {111} planes of the cubic phase with the following epitaxial orientation relationships: $(001)_\kappa$//$(111)_{TiX}$; $[100]_\kappa$//$[112]_{TiX}$. An explanation and a model for the CVD growth of metastable $\kappa$-$Al_2O_3$ have proposed earlier (Y. Yoursdshahyan, C. Ruberto, M. Halvarsson, V. Langer, S. Ruppi, U. Rolander and B. I. Lundqvist, Theoretical Structure Determination of a Complex Material: $\kappa$-$Al_2O_3$, *J. Am. Ceram. Soc.* 82 (6)(1999) 1365-1380).

When properly nucleated, $\kappa$-$Al_2O_3$ layers can be grown to a considerable thickness (>10 μm). The growth of even thicker layers of $\kappa$-$Al_2O_3$ can be ensured through re-nucleation on thin layers of, for example TiN, inserted in the growing $\kappa$-$Al_2O_3$ layer. When nucleation is ensured the $\kappa$→$\alpha$ transformation can be avoided during deposition by using a relatively low deposition temperature (<1000° C.). During metal cutting, the $\kappa$→$\alpha$ phase transformation has confirmed to occur resulting in flaking of the coating. In addition to this there are several other reasons why $\alpha$-$Al_2O_3$ should be preferred in many metal cutting applications. As shown earlier $\alpha$-$Al_2O_3$ exhibits better wear properties in cast iron (U.S. Pat. No. 5,137,774).

However, the stable $\alpha$-$Al_2O_3$ phase has been found to be more difficult to be nucleated and grown at reasonable CVD temperatures than the metastable $\kappa$-$Al_2O_3$. It has been experimentally confirmed that $\alpha$-$Al_2O_3$ can be nucleated, for example, on $Ti_2O_3$ surfaces, bonding layers of (Ti,Al)(C, O) or by controlling the oxidation potential using $CO/CO_2$ mixtures as shown in U.S. Pat. No. 5,654,035. The bottom line in all these approaches is that nucleation must not take place on the 111-surfaces of TiC, TiN, Ti(C,N) or Ti(C,O,N), otherwise $\kappa$-$Al_2O_3$ is obtained.

It should also be noted that in the prior-art methods higher deposition temperatures (about 1000° C.) are usually used to deposit $\alpha$-$Al_2O_3$. When the nucleation control is not complete, as is the case in many prior-art products, the produced $\alpha$-$Al_2O_3$ layers have, at least partly, been formed as a result of the $\kappa$-$Al_2O_3$→$\alpha$-$Al_2O_3$ phase transformation. This is especially the case when thick $Al_2O_3$ layers are considered. These kinds of $\alpha$-$Al_2O_3$ layers are composed of larger grains with transformation cracks. These layers exhibit much lower mechanical strength and ductility than the $\alpha$-$Al_2O_3$ layers that are composed of nucleated $\alpha$-$Al_2O_3$. Consequently, there is a need to develop techniques to control the nucleation step of $\alpha$-$Al_2O_3$.

The control of the $\alpha$-$Al_2O_3$ polymorph in industrial scale was achieved in the beginning of the 1990's with commercial products based on U.S. Pat. No. 5,137,774. Later modifications of this patent have been used to deposit $\alpha$-$Al_2O_3$ with preferred layer textures. In U.S. Pat. No. 5,654,035 an alumina layer textured in the (012) direction and in U.S. Pat. No. 5,980,988 in the (110) direction are disclosed. In U.S. Pat. No. 5,863,640 a preferred growth either along (012), or (104) or (110) is disclosed. U.S. Pat. No. 6,333,103 describes a modified method to control the nucleation and growth of $\alpha$-$Al_2O_3$ along the (10(10)) direction. US20020155325A1 describes a method to obtain a strong (300) texture in $\alpha$-$Al_2O_3$ using a texture modifying agent ($ZrCl_4$). The prior-art processes discussed above use all high deposition temperatures of about 1000° C.

US 2004/0028951A1 describes a new state-of-the-art technique to achieve a pronounced (012) texture. The commercial success of this kind of product demonstrates the importance to refine the CVD process of $\alpha$-$Al_2O_3$ towards fully controlled textures.

It is well established that the water gas shift reaction, in the absence of $H_2S$ or other dopants, is the critical rate-limiting step for $Al_2O_3$ formation, and to a great extent, controls the minimum temperature at which $Al_2O_3$ can be deposited. Further it is well established that the water-gas shift reaction is very sensitive for deposition pressure.

Extensive work has been done to deposit CVD $Al_2O_3$ at lower temperatures. Several $Al_2O_3$ layers using other than $AlCl_3$-$CO_2$—$H_2$ system have been investigated, including $AlCl_3$—CO—$CO_2$, $AlCl_3$—$C_2H_5OH$, $AlCl_3$—$N_2O$—$H_2$, $AlCl_3$—$NH_3$—$CO_2$, $AlCl_3$—$O_2$—$H_2O$, $AlCl_3$—$O_2$—Ar, $AlX_3$—$CO_2$ (where X is Cl, Br, I), $AlX_3$—$CO_2$—$H_2$ (where X is Cl, Br, I), $AlBr_3$—NO—$H_2$—$N_2$ and $AlBr_3$—NO—$H_2$—$N_2$. It is emphasised that these studies have been carried out without dopants (such as $H_2S$) and the effect of the deposition pressure has not been elucidated.

It is worth noticing that none of these latter systems have been commercially successful. Consequently, to provide a CVD process for depositing $Al_2O_3$ layers at temperatures below those currently used on a commercial scale is therefore highly desirable.

U.S. Pat. No. 6,572,991 describes a method to deposit $\gamma$-$Al_2O_3$ at low deposition temperatures. This work clearly shows that it is possible to obtain $Al_2O_3$ layers in the medium temperature range from the $AlCl_3$—$CO_2$—$H_2$ system. However, in this work it was not realised that nucleation surface controls the phase composition of $Al_2O_3$ and that deposition of $\alpha$-$Al_2O_3$ is thus possible at lower deposition temperatures. In the prior-art, it was considered impossible to deposit $\alpha$-$Al_2O_3$ at low temperatures and it was believed that $\gamma$-$Al_2O_3$ and $\kappa$-$Al_2O_3$ were the unavoidable low temperature phases.

OBJECTS AND SUMMARY OF THE INVENTION

It is an object of the present invention is to provide a new, improved alumina layer where the $\alpha$-$Al_2O_3$ phase consists of nucleated $\alpha$-$Al_2O_3$ with a strong, fully controlled (110) growth texture. According to the present invention $\alpha$-$Al_2O_3$ with the controlled (110) texture can be obtained within a wide temperature range from 750 to 1000° C., which can be considered surprising.

In one aspect of the invention, there is provided a cutting tool insert of a substrate at least partially coated with a coating with a total thickness of from about 10 to about 40 μm, of one or more refractory layers of which at least one layer is an alumina layer wherein said alumina layer is composed of columnar α-$Al_2O_3$ grains with texture coefficients a) TC(110) greater than about 2.0; and
b) TC(012), TC(104), TC(113), TC(024), TC(116) all less than about 1.5;

The texture coefficient TC(hkl) is defined as $$TC(hkl) = \frac{I(hkl)}{I_O(hkl)}\left\{\frac{1}{n}\sum\frac{I(hkl)}{I_O(hkl)}\right\}^{-1}$$

where
I(hkl)=measured intensity of the (hkl) reflection
$I_O$(hkl)=standard intensity according to JCPDS card no 46-1212
n=number of reflections used in the calculation
(hkl) reflections used are: (012), (104), (110), (113), (024), (116).

In another aspect of the invention, there is provided a method of coating a substrate with an $Al_2O_3$ layer wherein the α-$Al_2O_3$ layer is composed of columnar α-$Al_2O_3$ grains with a texture coefficient TC (110) greater than about 2.0 comprising depositing a (Ti,Al) (C,O,N) bonding layer on said substrate to provide a nucleation surface for said $Al_2O_3$, subjecting said nucleation surface to a modification treatment of a pulse treatment with a mixture of $TiCl_4$ and $H_2$, a purge with a neutral gas and an oxidizing pulse of a gas mixture including $N_2$ and $CO_2$ in a ratio of from about 100 to about 200, repeating the modification treatment and depositing α-$Al_2O_3$ having a texture coefficient TC(110) greater than about 2.0 at a temperature of from about 750 to about 1000° C.

The alumina layer with strong texture outperforms the prior art with random or other less developed and incompletely controlled textures. Further, increased toughness can be obtained when deposition is carried out at lower temperatures. Compared with prior-art products, the α-$Al_2O_3$ layer according the present invention is essentially free from transformation stresses, consisting of columnar, defect free, α-$Al_2O_3$ grains with low dislocation density and with improved cutting properties.

DETAILED DESCRIPTION OF THE PREFERRED EMBODIMENTS OF THE INVENTION

Figure 1:
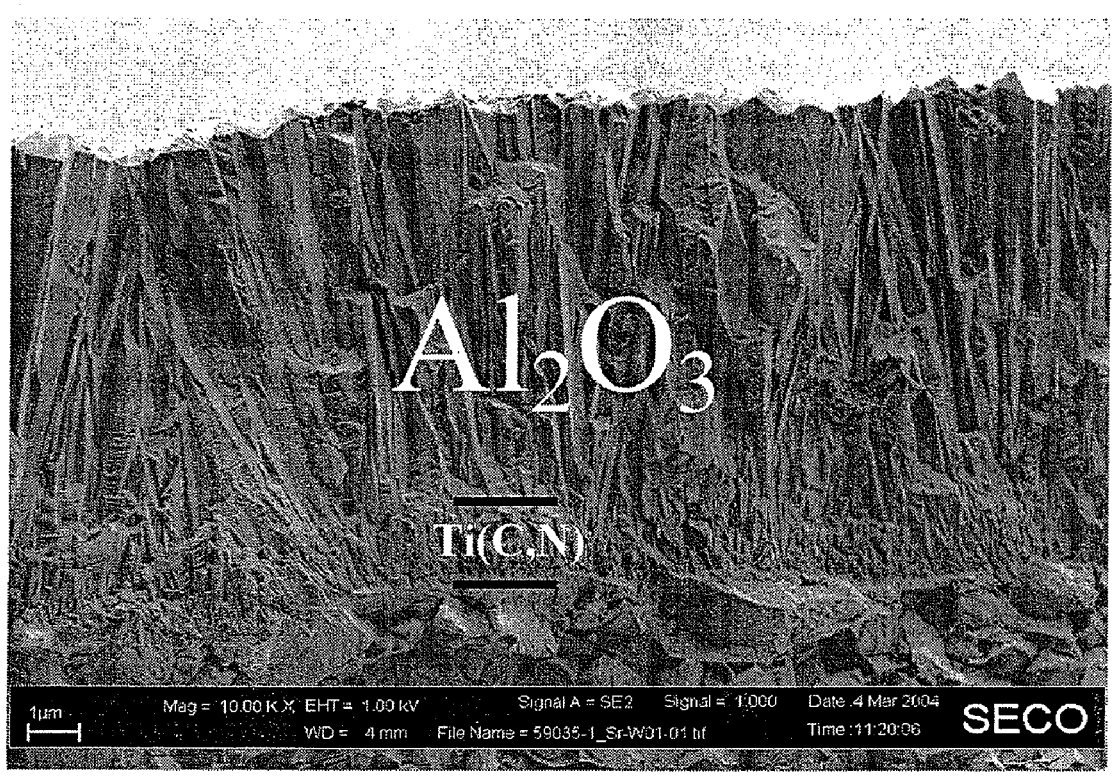
FIG. 1 shows a cross-section SEM image (magnification 10000×) of a typical alumina layer according to the present invention deposited on a MTCVD-Ti(C,N) layer. The alumina layer is composed of columnar grains. It is dense with no detectable porosity.

A method to deposit α-$Al_2O_3$ with a strong (110) texture in a temperature range of from about 750 to about 1000° C. is described. The invention is utilizing short pulses of precursors followed by purging steps with an inert gas such as Ar. After the purge, another precursor is applied as a short pulse. In addition to the texture control, the method can be used to produce finer grain sizes by increasing the number of nucleation sites. The texture-controlled α-$Al_2O_3$ layers deposited at medium temperature (about 800° C.) show enhanced toughness.

$Al_2O_3$ layers according to this invention outperform the prior art and are especially suitable be used in toughness demanding stainless steel-cutting applications such as interrupted cutting, turning with coolant and especially intermittent turning with coolant. The other area of application is to cut cast iron where the edge strength of this kind of alumina layer is superior to the prior art.

Ti(C,N) layer is used as an intermediate layer, which can be obtained either by conventional CVD or MTCVD, preferably by MTCVD. This invention makes it possible to deposit α-$Al_2O_3$ at same temperature as is used to deposit the intermediate MTCVD Ti(C,N) layer. Consequently, the heating-up period can be omitted after MTCVD.

To nucleate α-$Al_2O_3$ with the specified texture, several steps are needed. First, on the Ti(C,N) layer a bonding layer characterised by the presence of an Al concentration gradient is deposited. Nitrogen and $CH_3CN$ are applied during deposition of this bonding layer. The aluminium content on the surface of this layer being considerably, about 30%, higher than in the bonding layer according to U.S. Pat. No. 5,137,774 (prior-art) and the bonding layer is obviously containing nitrogen. The surface of this bonding layer is subjected to an additional treatment(s).

Nucleation is started with a $TiCl_4/H_2$ pulse with a duration of from about 2 to about 5 minutes. After that a purge with a neutral gas, e.g., Ar, (duration about 5 minutes) is applied in order to remove excess $Cl^-$ from the surface. After this, an oxidizing pulse is applied using a $CO_2/H_2/N_2/Ar$ ($CO_2$=about 0.15%, $H_2$=about 10%, $N_2$=from about 22 to about 30%, Ar=balance) gas mixture to transform the adsorbed Ti into $Ti_2O_3$. The oxidizing step has to be relatively short, from about 0.5 to about 5 minutes to secure (110) nucleation. The key to obtain the specified growth texture is the control of the oxidation potential of the $CO_2/H_2/N_2/Ar$ mixture by adjustment of the $N_2:CO_2$ ratio. This ratio should be from about 100 to about 200, preferably from about 150 to about 200. The use of a controlled oxygen potential in combination with the correct time and number of pulses enables the correct nucleation mode. Typical pulse times may range from about 10 seconds to about 5 minutes depending on the duration of the pulse. The oxidizing pulse is again followed by an Ar purge. These steps should be repeated several times, preferably from about 2 to about 5 times, in sequence to increase the amount of α-$Al_2O_3$ nuclei. Excessive oxidation must be avoided. A person skilled in the art can find the best and optimised combination between the duration and the amount of the steps.

Detailed Description of the Nucleation Steps

1. Depositing a bonding layer of from about 0.1 to about 1 μm thick in a gas mixture of from about 2 to about 3% $TiCl_4$, $AlCl_3$ increasing from about 0.5 to about 5%, from about 3 to about 7% CO, from about 1 to about 3% $CO_2$, from about 2 to about 10% $N_2$ and balance $H_2$ at about from about 750 to about 1000° C., preferably at about 800° C. and at a pressure of from about 50 to about 200 mbar.
2. Purging by Ar for about 5 min.
3. Treating the bonding layer in a gas mixture of from about 1 to about 3% $TiCl_4$ in hydrogen for about 2 to about 60 min at from about 750 to about 1000° C., preferably at about 800° C. and at a pressure of from about 50 about 200 mbar.
4. Purging by Ar for about 5 min.
5. Treating in a gas mixture of from about 0.1 to about 0.15% $CO_2$ (preferably about 0.15%), from about 10 to about 30% $N_2$ (preferably from about 22.5 to about 30% when the $CO_2$ content is about 15%), about 10% $H_2$, balance Ar at a pressure of from about 50 to about 200 mbar for about 0.5 to about 5 minutes at a temperature of from about 750 to about 1000° C., depending on the temperature for the subsequent deposition of the alumina layer.
6. Purging by Ar for about 5 min.
7. Repeating steps 3-6 to obtain an optimum oxidation level.
8. Depositing an alumina layer at a temperature of from about 950 to about 1000° C. and a pressure of from about 50 to about 200 mbar with desired thickness according to known technique or depositing an alumina layer at from about 750 to about 950° C. using higher deposition pressures (from about 200 to about 500 mbar) together with higher amounts (from about 0.5 to about 1.5%) of catalyzing precursors such as $H_2S$ or $SO_x$, preferably $H_2S$.

The growth of the alumina layer onto the nucleation layer is started by sequencing the reactant gases in the following order: CO, $AlCl_3$, $CO_2$. The process temperatures of from about 750 to about 1000° C. can be used since the texture is determined by the nucleation surface.

The present invention also relates to a cutting tool insert of a substrate at least partially coated with a coating with a total thickness of from about 15 to about 40 μm, preferably from about 20 to about 25 μm, of one or more refractory layers of which at least one layer is an alpha alumina layer. The $\alpha\text{-}Al_2O_3$ layer deposited according to this invention is dense and exhibits a very low defect density. It is composed of columnar grains with a strong (110) texture. The columnar grains have a length/width ratio of from about 2 to about 15, preferably from about 5 to about 10.

The texture coefficients (TC) for the $\alpha\text{-}Al_2O_3$ according to this invention layer is determined as follows:

$$TC(hkl) = \frac{I(hkl)}{I_O(hkl)} \left\{ \frac{1}{n} \sum \frac{I(hkl)}{I_O(hkl)} \right\}^{-1}$$

where
I(hkl)=intensity of the (hkl) reflection
$I_O$(hkl)=standard intensity according to JCPDS card no 46-1212
n=number of reflections used in the calculation
(hkl) reflections used are: (012), (104), (110), (113), (024), (116).

The texture of the alumina layer is defined as follows:
TC(110) greater than about 2.0, preferably greater than about 3.0 and most preferably greater than about 4.0. Simultaneously, TC(104), TC(113), TC(116) should be all less than about 1.5, preferably less than about 1.0 and most preferably less than about 0.6.

It is should be noted that the intensities of the reflections (012) and (024) are related. TC (024) is usually less than TC(012). In order to obtain optimum performance for the alumina layer with strong (110) texture TC(012) and TC(024) should be less than about 1.5, preferably less than about 1.0 and most preferably less than about 0.6.

The substrate comprises a hard material such as cemented carbide, cermets, ceramics, high speed steel or a super hard material such as cubic boron nitride, CBN, or diamond preferably cemented carbide or CBN. By CBN is herein meant a cutting tool material containing at least 40 vol-% CBN. In a preferred embodiment, the substrate is a cemented carbide with a binder phase enriched surface zone.

The coating comprises a first layer adjacent the body of CVD Ti(C,N), CVD TiN, CVD TiC, MTCVD Ti(C,N), MTCVD Zr(C,N), MTCVD Ti(B,C,N), CVD HfN or combinations thereof, preferably of Ti(C,N), having a thickness of from about 1 to about 20 μm, preferably from about 1 to about 10 μm and said $\alpha\text{-}Al_2O_3$ layer adjacent said first layer having a thickness of from about 1 to about 40 μm, preferably from about 1 to about 20 μm, most preferably from about 1 to about 10 μm. Preferably, there is an intermediate layer of TiN between the substrate and said first layer with a thickness of less than about 3 μm, preferably from about 0.5 to about 2 μm.

In one embodiment, the $\alpha\text{-}Al_2O_3$ layer is the uppermost layer.

In another embodiment, there is a layer of carbide, nitride, carbonitride or carboxynitride of one or more of Ti, Zr and Hf, having a thickness of from about 0.5 to about 3 μm, preferably from about 0.5 to about 1.5 μm atop the $\alpha\text{-}Al_2O_3$ layer. Alternatively this layer has a thickness of from about 1 to about 20 μm, preferably from about 2 to about 8 μm.

In yet another embodiment, the coating includes a layer of $\kappa\text{-}Al_2O_3$ and/or $\gamma\text{-}Al_2O_3$ preferably atop the $\alpha\text{-}Al_2O_3$, with a thickness of from about 0.5 to about 10, preferably from 1 to about 5 μm.

The invention is additionally illustrated in connection with the following examples, which are to be considered as illustrative of the present invention. It should be understood, however, that the invention is not limited to the specific details of the examples.

Example 1

Cemented carbide cutting inserts with a composition of 5.9% Co and balance WC (hardness about 1600 HV) were coated with a layer of MTCVD Ti(C,N). The thickness of the MTCVD layer was about 2 μm. On to this layer three different $\alpha\text{-}Al_2O_3$ layers were deposited consisting of about 10 μm $\alpha\text{-}Al_2O_3$ each:

Layer a) contained a (110) textured $\alpha\text{-}Al_2O_3$ layer and was deposited according to the present invention at a temperature of 1000° C. The detailed process data is given in Table 1.

Layer b) was deposited according to the prior art at a temperature of 1000° C.

Layer c) was deposited according to the present invention at 780° C. The detailed process data is given in Table 2.

TABLE 1

Deposition process for a Coating a) with (110) texture at 1000° C.:

| Step 1: Bonding layer | |
|---|---|
| Gas mixture | $TiCl_4$ = 2.8% |
| | $CH_3CN$ = 0.5% |
| | $AlCl_3$ = increasing from 0.8 to 4.2% |
| | CO = 5.8% |
| | $CO_2$ = 2.2% |

TABLE 1-continued

Deposition process for a Coating a) with (110) texture at 1000° C.:

|  |  |
|---|---|
|  | $N_2$ = 5% |
|  | Balance: $H_2$ |
| Duration | 30 min |
| Temperature | 1000° C. |
| Pressure | 100 mbar |

Step 2: Purge

|  |  |
|---|---|
| Gas | Ar = 100% |
| Duration | 5 min |
| Temperature | 1000° C. |
| Pressure | 50 mbar |

Step 3: Pulse 1

|  |  |
|---|---|
| Gas mixture | $TiCl_4$ = 2.2% |
|  | $H_2$ = Balance |
| Duration | 5 min. |
| Temperature | 1000° C. |
| Pressure | 50 mbar |

Step 4: Purge

|  |  |
|---|---|
| Gas | Ar = 100% |
| Duration | 5 min |
| Temperature | 1000° C. |
| Pressure | 50 mbar |

Step 5: Pulse 2

|  |  |
|---|---|
| Gas mixture | $CO_2$ = 0.15% |
|  | $N_2$ = 25% |
|  | $H_2$ = 10% |
|  | Balance: Ar |
| Duration | 2 min |
| Temperature | 1000° C. |
| Pressure | 100 mbar |

Step 6: Purge

|  |  |
|---|---|
| Gas | Ar = 100% |
| Duration | 5 min |
| Temperature | 1000° C. |
| Pressure | 50 mbar |

Step 7: Nucleation step

|  |  |
|---|---|
| Gas mixture | $AlCl_3$ = 3.2% |
|  | HCl = 2.0% |
|  | $CO_2$ = 1.9% |
|  | Balance $H_2$ |
| Duration | 60 min |
| Temperature | 1000° C. |
| Pressure | 50 mbar |

Step 8: Deposition

|  |  |
|---|---|
| Gas mixture | $AlCl_3$ = 4.2% |
|  | HCl = 1.0% |
|  | $CO_2$ = 2.1% |
|  | $H_2S$ = 0.2% |
|  | Balance: $H_2$ |
| Duration | 520 min |
| Temperature | 1000° C. |
| Pressure | 50 mbar |

Steps 3-6 were repeated three times.

TABLE 2

Deposition process for a Coating a) with (110) texture at 780° C.:

Step 1: Bonding layer

|  |  |
|---|---|
| Gas mixture | $TiCl_4$ = 2.8% |
|  | $CH_3CN$ = 0.7% |
|  | $AlCl_3$ = increasing from 0.8 to 4.2% |
|  | CO = 5.8% |
|  | $CO_2$ = 2.2% |

TABLE 2-continued

Deposition process for a Coating a) with (110) texture at 780° C.:

|  |  |
|---|---|
|  | $N_2$ = 5% |
|  | Balance: $H_2$ |
| Duration | 40 min |
| Temperature | 780° C. |
| Pressure | 100 mbar |

Step 2: Purge

|  |  |
|---|---|
| Gas | Ar = 100% |
| Duration | 5 min |
| Temperature | 780° C. |
| Pressure | 50 mbar |

Step 3: Pulse 1

|  |  |
|---|---|
| Gas mixture | $TiCl_4$ = 2.2% |
|  | $H_2$ = Balance |
| Duration | 5 min. |
| Temperature | 780° C. |
| Pressure | 50 mbar |

Step 4: Purge

|  |  |
|---|---|
| Gas | Ar = 100% |
| Duration | 5 min |
| Temperature | 780° C. |
| Pressure | 50 mbar |

Step 5: Pulse 2

|  |  |
|---|---|
| Gas mixture | $CO_2$ = 0.15% |
|  | $N_2$ = 25% |
|  | $H_2$ = 10% |
|  | Balance: Ar |
| Duration | 2 min |
| Temperature | 780° C. |
| Pressure | 100 mbar |

Step 6: Purge

|  |  |
|---|---|
| Gas | Ar = 100% |
| Duration | 5 min |
| Temperature | 780° C. |
| Pressure | 50 mbar |

Step 7: Nucleation step

|  |  |
|---|---|
| Gas mixture | $AlCl_3$ = 3.2% |
|  | HCl . . . = 2.0% |
|  | $CO_2$ = 1.9% |
|  | Balance $H_2$ |
| Duration | 60 min |
| Temperature | 780° C. |
| Pressure | 50 mbar |

Step 8: Deposition

|  |  |
|---|---|
| Gas mixture | $AlCl_3$ = 4.1% |
|  | HCl = 1.0% |
|  | $CO_2$ = 2.3% |
|  | $H_2S$ = 0.9% |
|  | Balance: $H_2$ |
| Duration | 600 min |
| Temperature | 780° C. |
| Pressure | 350 mbar |

Steps 3-6 were repeated three times.

Example 2

Layers a), b) and c) were studied using X-ray diffraction. The texture coefficients were determined and are presented in Table 2. As clear from Table 3 a strong (110) texture was obtained at 1000° C. and 780° C. when nucleation was carried out according to the present invention. The (012) and (024) reflections are slightly pronounced as compared with the other background reflections.

TABLE 3

| Hkl | Invention, (Layer a) | Prior art (coating b) | Invention, (layer c) |
|---|---|---|---|
| 012 | 0.59 | 0.97 | 0.86 |
| 104 | 0.30 | 1.14 | 0.20 |
| 110 | 4.17 | 0.95 | 3.82 |
| 113 | 0.21 | 0.99 | 0.24 |
| 024 | 0.48 | 0.86 | 0.62 |
| 116 | 0.25 | 1.09 | 0.25 |

Example 3

Figure 2:
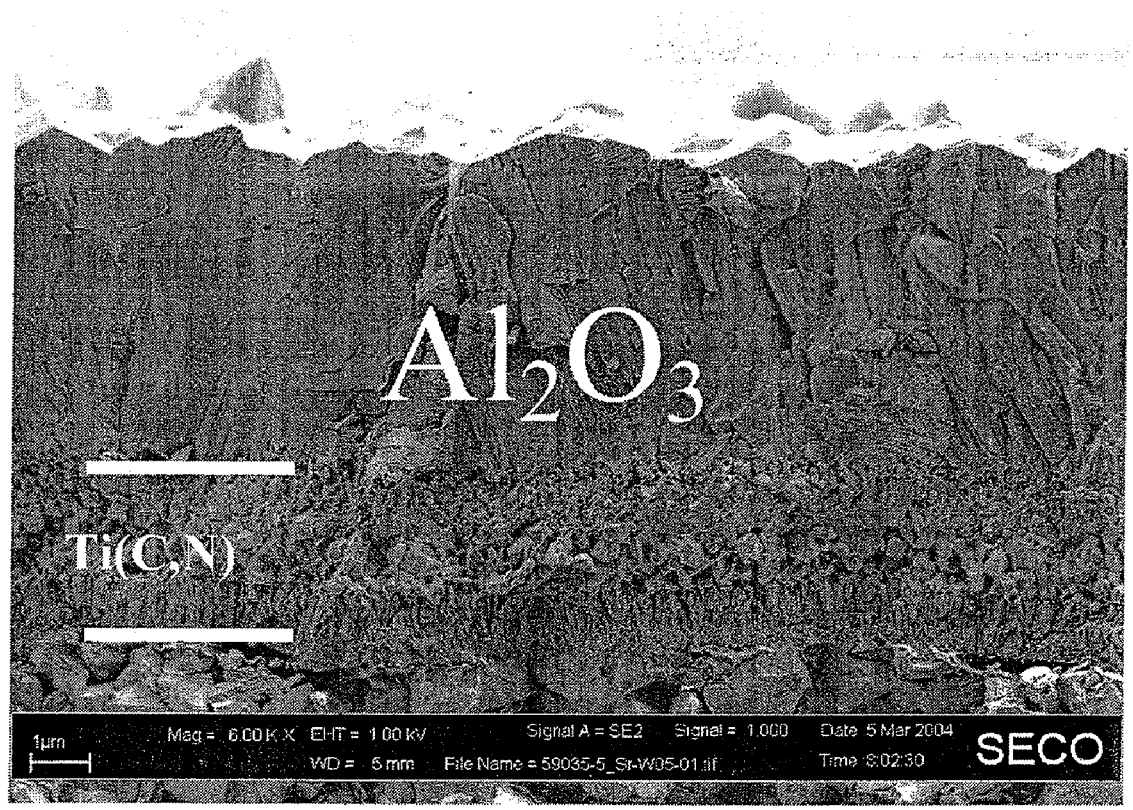
FIG. 2 shows a cross-section SEM image of a typical layer according the prior-art (magnification 6000×) deposited on a MTCVD-Ti(C,N) layer. The alumina layer is composed of large nearly equiaxed grains. Porosity is visible in the alumina layer. Interfacial porosity between the alumina layer and the Ti(C,N) layer is also visible.

Layers a) and b) were studied using Scanning Electron Microscopy. The cross section images of the layers are shown in FIGS. 1 and 2, respectively. The differences in microstructure and morphology are clear.

Example 4

The coatings a and b from the Example 1 were tested with respect to edge toughness in longitudinal turning in cast iron.

| | |
|---|---|
| Work piece: | Cylindrical bar |
| Material: | SS0130 |
| Insert type: | SNUN |
| Cutting speed: | 400 m/min |
| Feed: | 0.4 mm/rev |
| Depth of cut: | 2.5 mm |
| Remarks: | dry turning |

The inserts were inspected after 2 and 4 minutes of cutting. As clear from Table 4 the edge toughness of the prior art product was considerably enhanced when the layer was produced according to this invention.

TABLE 4

| | Flaking of the edge line (%) after 2 minutes | Flaking of the edge line (%) After 6 minutes |
|---|---|---|
| Layer a (Invention) | 0 | 4 |
| Layer b (prior-art) | 12 | 22 |

Example 5

The layer produced according to this invention was compared with a market leader, referred here as Competitor X. This coating is composed of MTCVD Ti(C,N) and $\alpha$-$Al_2O_3$. XRD was used to determine the texture coefficients for these competitor coatings. Two inserts from Competitor X were randomly chosen for XRD. Table 5 shows the obtained TCs for the Competitor X. The alumina layer from Competitor X exhibit a (110) texture and can be compared with the present inventor, Table 1.

TABLE 5

| Hkl | TC (hkl) | |
|---|---|---|
| 012 | 0.71 | 0.57 |
| 104 | 0.92 | 0.86 |
| 110 | 1.69 | 1.92 |
| 113 | 0.48 | 0.40 |
| 024 | 1.16 | 1.14 |
| 116 | 1.04 | 1.11 |

The X-rayed inserts from the competitor X were compared with inserts produced according to the present invention, Layer a).

Two inserts produced according to this invention were compared with the two Competitor X inserts with respect to flank wear resistance in face turning of ball bearing material

| | |
|---|---|
| Work piece: | Cylindrical tubes (Ball bearings) |
| Material: | SS2258 |
| Insert type: | WNMG080416 |
| Cutting speed: | 500 m/min |
| Feed: | 0.5 mm/rev |
| Depth of cut: | 1.0 mm |
| Remarks: | Dry turning |

Tool life criterion: Flank wear >0.3 mm, three edges of each variant were tested.

| Results: | Tool life (min) |
|---|---|
| Layer a | 27.5 (invention) |
| Layer a | 25.5 (invention) |
| Competitor 1 | 14.5 (prior art) |
| Competitor 2 | 15.5 (prior art) |

Example 6

Layers a), b) and c) deposited on Co-enriched substrates were tested with respect to toughness in longitudinal turning with interrupted cuts.

| | |
|---|---|
| Work piece: | Cylindrical slotted bar |
| Material: | SS1672 |
| Insert type: | CNMG120408-M3 |
| Cutting speed: | 140 m/min |
| Feed: | 0.1, 0.125, 0.16, 0.20, 0.25, 0.315, 0.4, 0.5, 0.63, 0.8 mm/rev gradually increased after 10 mm length of cut |
| Depth of cut: | 2.5 mm |
| Remarks: | dry turning |

Tool life criteria: Gradually increased feed until edge breakage. 10 edges of each variant were tested.

TABLE 6

| | Mean feed at breakage (mm/rev) |
|---|---|
| Layer a (invention) | 0.32 |
| Layer b (prior art) | 0.12 |
| Layer c (invention) | 0.40 |

The test results show (Table 6) that layers according to this invention outperform the prior-art. Layer c) according to the invention exhibited clearly the best toughness behaviour.

Example 7

Cubic boron nitride (CBN) inserts containing about 90% of polycrystalline CBN(PCBN) were coated according to this invention at 780° C. (layer c)) and according to prior art discussed in Example 1. The coated CBN was compared with uncoated CBN insert in cutting of steel containing ferrite. It is known that B has a high affinity to ferrite and diffusion wear occurs at high cutting speeds. As shown in Table 7 the layer according to this invention is superior to the prior art.

| Work piece: | Cylindrical bar |
|---|---|
| Material: | SS0130 |
| Insert type: | SNUN |
| Cutting speed: | 800 m/min |
| Feed: | 0.4 mm/rev |
| Depth of cut: | 2.5 mm |
| Remarks: | dry turning |

TABLE 7

| | Life time (min) |
|---|---|
| Coated CBN (Invention) | 20 |
| Coated according to prior art | 11 |
| Uncoated CBN | 9 |

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. A method of coating a substrate with an $Al_2O_3$ layer wherein the $\alpha$-$Al_2O_3$ layer is composed of columnar $\alpha$-$Al_2O_3$ grains with a texture coefficient TC (110) greater than about 2.0 comprising depositing a (Ti,Al)(C,O,N) bonding layer on said substrate to provide a nucleation surface for said $Al_2O_3$, subjecting said nucleation surface to a modification treatment of a pulse treatment with a mixture of $TiCl_4$ and $H_2$, a purge with a neutral gas and an oxidizing pulse of a gas mixture including $N_2$ and $CO_2$ in a ratio of $N_2$:$CO_2$ from about 100 to about 200, repeating the modification treatment and depositing $\alpha$-$Al_2O_3$ having a texture coefficient TC(110) greater than about 2.0 at a temperature of from about 750 to about 1000° C.

2. The method of claim 1 wherein each said pulse treatment is conducted for a time of from about 0.5 to about 5 minutes.

3. The method of claim 1 wherein the neutral gas is argon.

4. The method of claim 1 wherein the mixture of $TiCl_4$ and $H_2$ comprises a mixture of about 1 to about 3% $TiCl_4$.

5. The method of claim 4 wherein the said pulse treatment with $TiCl_4$ and $H_2$ is conducted for a time of from about 2 to about 60 minutes at a temperature of from about 750 to 1000° C. and a pressure of from about 50 to about 200 mbar.

6. The method of claim 1 wherein the oxidizing pulse comprises a mixture of from about 0.1 to about 0.15% $CO_2$ from about 10 to about 30% $N_2$, about 10% $H_2$, balance Ar.

7. The method of claim 6 wherein the oxidizing pulse is conducted for a time of from about 0.5 to about 5 minutes, a temperature of from about 750 to about 1000° C. and a pressure of from about 50 to about 500 mbar.

8. The method of claim 1 wherein the $\alpha$-$Al_2O_3$ deposition is conducted at a temperature of from about 950 to about 1000° C.

9. The method of claim 1 wherein the $\alpha$-$Al_2O_3$ deposition is conducted at a temperature of from about 750 to 950° C. at a pressure of from about 200 to about 500 mbar.

10. The method of claim 9 wherein there is present a catalyzing precursor in an amount of from about 0.5 to about 1.5%.

11. The method of claim 10 wherein the catalyzing precursor is $H_2S$ or $SO_x$.

12. The method of claim 11 wherein the catalyzing precursor is $H_2S$.

13. The method of claim 1 wherein the ratio of $N_2$:$CO_2$ is from about 150 to about 200.

14. The method of claim 1 wherein the (Ti,Al)(C,O,N) bonding layer has an aluminum concentration gradient.

15. The method of claim 1 wherein the oxidizing pulse is followed by an additional purge with a neutral gas.

16. The method of claim 1 wherein the steps of the modification treatment are repeated about 2 to 5 times, in sequence.

* * * * *